Figure 1:
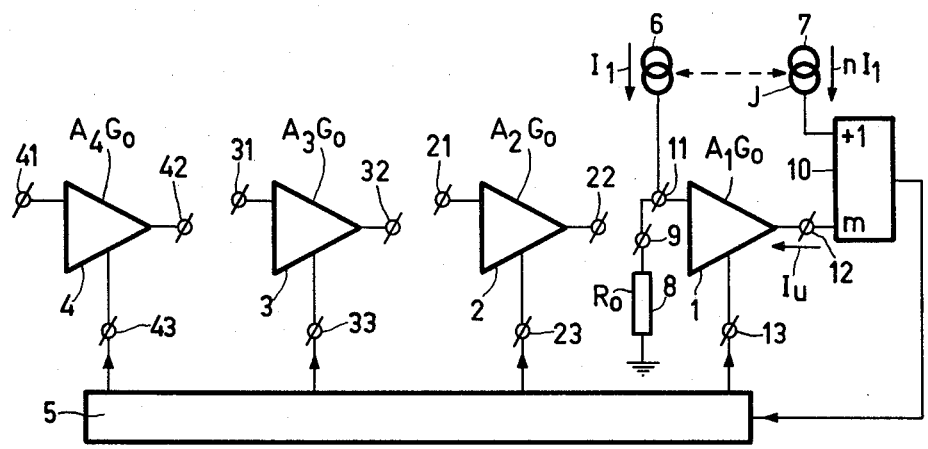

United States Patent [19]

Boeke

[11] 4,388,539
[45] Jun. 14, 1983

[54] INTEGRATED CIRCUIT COMPRISING A PLURALITY OF VOLTAGE-CURRENT CONVERTERS

[75] Inventor: Wouter M. Boeke, Nijmegen, Netherlands

[73] Assignee: U.S. Philips Corporation, New York, N.Y.

[21] Appl. No.: 234,088

[22] Filed: Feb. 13, 1981

[30] Foreign Application Priority Data

Feb. 25, 1980 [NL] Netherlands ............... 8001115

[51] Int. Cl.³ .............. H03K 17/14; H02J 1/04; H03F 3/45
[52] U.S. Cl. ........................ 307/491; 307/297; 307/497; 323/316; 330/257; 330/261
[58] Field of Search ............ 307/297, 304, 491, 494, 307/497, 501; 323/312, 315, 316; 330/257, 261, 288, 296

[56] References Cited

U.S. PATENT DOCUMENTS

| | | | |
|---|---|---|---|
| 3,743,850 | 7/1973 | Davis ........................ | 307/297 X |
| 4,004,247 | 1/1977 | Van de Plassche ...... | 323/315 X |
| 4,010,425 | 3/1977 | Dingwall et al. ........ | 330/257 |
| 4,152,663 | 5/1979 | Van de Sande .......... | 330/288 X |

Primary Examiner—Larry N. Anagnos
Assistant Examiner—David R. Hudspeth
Attorney, Agent, or Firm—Robert T. Mayer; Bernard Franzblau

[57] ABSTRACT

An integrated circuit comprising a plurality of adjustable voltage-current converters, of which one converter is employed as a reference converter. The reference converter is included in a control loop. To the input of the reference converter an input voltage is applied in that a first current is passed through a reference resistor connected to said input. A second current, which is in a fixed ratio to said first current, is compared with the output current of the reference converter and this reference converter is then biassed so that its output current corresponds to said second current. In this way the transconductance of the reference converter is determined by the reference resistor and the ratio of the first and the second current, so that this transconductance is highly independent of process, temperature and supply-voltage variations. The other converters are biassed by signals derived from the bias signals for the reference converter and thus have corresponding transconductances.

3 Claims, 3 Drawing Figures

INTEGRATED CIRCUIT COMPRISING A PLURALITY OF VOLTAGE-CURRENT CONVERTERS

The invention relates to an integrated circuit comprising a plurality of voltage-current converters (1, 2, 3, 4), each having an input (11, 21, 31, 41) and an output (12, 22, 32, 42) and a bias-signal input (13, 23, 33, 43) for controlling the transconductances ($a_1G_0$, $a_2G_0$, $a_3G_0$, $a_4G_0$) of said voltage-current converters by means of a bias signal on said bias-signal input, the transconductances of the voltage-current converters being in a substantially fixed ratio to each other. The IC also includes a bias-signal source (5, 51, 52, 53, 54) for applying bias signals, which are in a substantially fixed ratio to each other, to said bias-signal inputs, and a control network for controlling the bias-signal generator in such a way that the transconductances of the voltage-current converters are highly insensitive to process variations and variations in operating conditions, at least one of the voltage-current converters (1) being included in the control network as a reference converter.

Voltage-current converters are inter alia employed in analogue filters. For this application it is of importance that the transconductances of said voltage-current converters are highly constant or can be adjusted in a reliable manner, are highly independent of process variations during manufacture of the integrated circuits and are also highly independent of variations in operating conditions, such as supply voltage and temperature. On the basis of the fact that in an integrated circuit various parameters may vary substantially but that the mutual ratios of the parameters of similar components vary to a comparatively small extent, said independence can readily be achieved in an integrated circuit by the steps mentioned in the preamble. Such an integrated circuit is known from the publication "Electronic Design" of Feb. 15, 1978, pages 26–32, in particular the circuit arrangement shown on page 30. In this integrated circuit two voltage-current converters operating as an integrator are arranged as a voltage-controlled oscillator. The output frequency of the oscillator thus formed is compared with a reference frequency in a phase comparator and the voltage-controlled oscillator is controlled so that the oscillating frequency of said oscillator corresponds to the reference frequency. The control voltage applied to the oscillator is also applied to an analogue filter comprising voltage-current converters operated as integrators, so that the filter frequency corresponds to the reference frequency and is therefore highly independent of process and temperature variations. In such a circuit arrangement the voltage-current converters are stabilized indirectly and their use is limited to a range of application where a stable frequency is available. Moreover, the known stabilizing method demands comparatively complex circuitry.

It is an object of the invention to provide an integrated circuit of the type mentioned in the preamble, in which a number of voltage-current stabilizers can simply be stabilized in respect of process variations and variations in operating conditions.

To this end the invention is characterized in that the control network comprises a first (6) and a second (7) current source whose currents ($I_1$ and $nI_1$ respectively) are in a substantially fixed ratio to each other. A terminal (9) is coupled to the input (11) of the reference converter (1) for coupling to a reference resistance element (8) which input (11) is included in the output circuit of the first current source. A comparing control amplifier (10) is included between the output of the reference converter and a control input of the bias-signal generator for comparing the output current of the reference converter and the current from the second current source and controlling the bias-signal generator in such a way that a substantially fixed ratio is maintained between the output currents of the reference converter and the second current source.

The invention is based on the recognition that, by applying a first current, whose magnitude is unknown per se and which is subject to variations, to the input of the reference converter and a second current, which is in a fixed ratio to said current—which is easy to realize in integrated circuits—to a comparator in order to compare the output current of the reference converter with said second current, and by controlling said reference converter in such a way that its output current is in a fixed ratio, specifically is equal, to said second current, the transconductance of said reference converter, regardless of the absolute value of the first and the second current, is inversely proportional to the resistance of a reference resistor arranged at the input of said reference converter—which in practice is frequently a precision resistor which is externally connected to the integrated circuit, or a resistor which is simulated by means of switched capacitances whose equivalent resistance is determined by a switching frequency. With the control signal thus obtained or with the signals which are in a fixed ratio thereto the transconductances of all the other voltage-current converters are then also related to said reference resistance.

Figure 2:
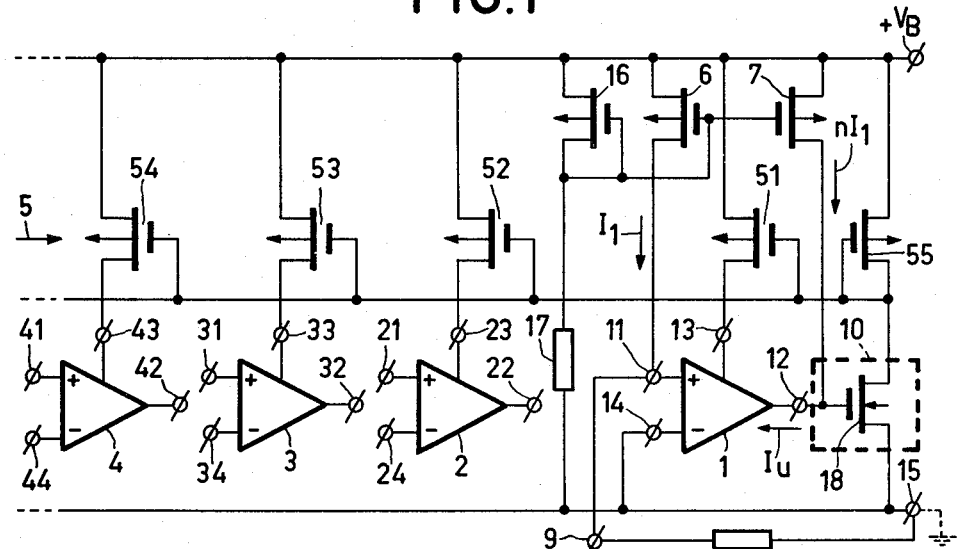
Figure 3:
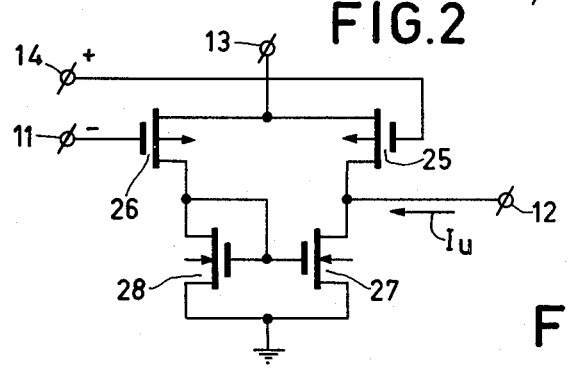

The invention will be described in more detail with reference to the drawing, in which:

FIG. 1 is a block diagram of a circuit arrangement in accordance with the invention, FIG. 2 represents a preferred embodiment of the circuit of FIG. 1 employing C-MOS transistors, and FIG. 3 represents an embodiment of the voltage-current converter used in the circuit arrangement of FIG. 2.

FIG. 1 shows the block diagram of an integrated circuit in accordance with the invention. It comprises a number of voltage-current converters, four of which 1, 2, 3 and 4 are shown, which each have an input 11, 21, 31 and 41, an output 12, 22, 32 and 42 and a bias input 13, 23, 33 and 43 respectively. Via their bias inputs the voltage-current converters receive bias signals from a bias-signal generator 5, which supplies mutually related bias signals. The converters 1, 2, 3 and 4 have transconductances $a_1G_0$, $a_2G_0$, $a_3G_0$ and $a_4G_0$ respectively, which are in a fixed ratio $a_1:a_2:a_3:a_4$ to each other, said ratio being determined by the mutual structure of said converters and/or the mutual realtionship of the control signals supplied by the bias generator 5. In practice, said transconductances will frequently be selected to be equal ($a_1=a_2=a_3=a_4=1$).

Voltage-current converter 1 is selected as a reference converter. Via a resistor 8 having a resistance $R_0$, which resistor may be connected to a pin 9 outside the integrated circuit, its input 11 is connected to ground in the present example. The integrated circuit further comprises a first (6) and a second (7) current source which are coupled to each other. These current sources 6 and 7 supply currents of magnitudes $I_1$ and $nI_1$ respectively, which are in a fixed ratio 1:n to each other. The current $I_1$ flows via resistor 8 and produces a voltage $I_1R_0$ on input 11 so that the reference converter 1 supplies an output current $I_u=a_1G_0R_0I_1$. In a comparing amplifier 10 this current is weighted by a factor m—in practice generally equal to 1—and compared with the current $nI_1$. This comparing amplifier may for example be a differential voltage amplifier with resistors at its inputs, but alternatively, as in the example of FIG. 2, a high-ohmic voltage amplifier whose input is a junction between the current source 7 and the output of the reference converter. The output signal of the comparing amplifier controls the bias-signal generator 5 so that in the case of an adequate loop gain in the control loop constituted by the comparing amplifier 10, the bias-signal generator 5 and the reference converter 1, $mI_u=nI_1$, which yields the relationship $a_1G_0=n/m\cdot 1/R_0$ for the transconductance of the reference converter 1. In the practical case that $n=m=1$ and $a_1=a_2=a_3=a_4=1$, this yields $G_0=1/R_0$. This relationship is only subject to variations of the parameters $a_1$, n and m, which represent ratios and are subject to a comparatively small spread or variation in integrated circuits. The same applies to the other converters owing to the coupling via the bias-signal generator 5.

The reference resistor 8 with a resistance value $R_0$ may also be simulated by means of a switched capacitance, so that the apparent resistance $R_0$ is determined by the value of said capacitance and the switching frequency, which may for example be of practical importance in said filter applications if a clock signal is present. Since such filter circuits employ capacitances and the resistance $R_0$ is also determined by such a capacitance, a significant advantage accrues in that the absolute value of the various capacitances is no longer of importance. Indeed, a variation of the filter capacitance is then compensated for in that the apparent resistance $R_0$ of the simulated resistor 8 varies in a compensating sense. An example of a resistor simulated by means of a switched capacitance is inter alia described in "IEEE Transactions on Circuits and Systems", Vol. CAS-26, no. 2, February 1979, pages 140–144.

FIG. 2 shows essentially the same circuit arrangement as FIG. 1, the voltage-current converters being shown with differential inputs by way of illustration. In this example the inverting input 14 of the reference converter is internally connected to ground, so that for the resistor 8, which is included between the differential inputs 11 and 14, only one additional external pin 9 is required because an earthing pin is already available.

The bias-signal generator 5 is constituted by a controlled multiple current source with p-channel transistors 51, 52, 53 and 54, whose source electrodes are connected to a positive power supply terminal $+V_B$, whose drain electrodes are connected to the respective bias inputs 13, 23, 33 and 43, and whose gate electrodes are connected to the gate and drain electrode of a p-channel transistor 55, whose source electrode is connected to the power supply terminal $+V_B$. Thus, the transistors 51, 52, 53 and 54 each form a current mirror with transistor 55, enabling any desired non-unity current ratios to be realized by suitable geometry ratios. The current sources 6 and 7 are also constituted by p-channel transistors arranged as current mirrors using a transistor 16 with interconnected gate and drain electrodes as input transistor, which transistor is included in series with a resistor 17 between the power supply terminals 15 and $+V_B$. The current ratio n is again determined by the geometry ratios of the transistors which are arranged as current sources 6 and 7. The comparing amplifier 10 is constituted by an n-channel transistor 18, whose source electrode is connected to ground and whose gate electrode is connected to the output 12 of the reference converter 1 and to the output of the current source 7. Comparison is effected in that the gate electrode of transistor 18 draws no current, so that $I_u=nI_1$. The drain electrode of transistor 18 is connected to the positive supply terminal $+V_B$ via input transistor 55 of the bias signal generator and thus controls said bias generator in such a way that the relationship $I_u=nI_1$ is satisfied.

The voltage-current converters 1, 2, 3 and 4 may be designed in various manners.

FIG. 3 shows a simple embodiment of such a voltage-current converter in C-MOS with a current-controlled transconductance. It comprises two p-channel transistors 25 and 26 connected as a differential pair, the drain current being coupled out via a current mirror comprising n-channel transistors 27 and 28. The bias signal is applied to the common source electrodes (13) of the transistors 25 and 26 as a current, the gate electrodes constituting the differential input, so that the transconductance of this converter is determined by the "slopes" of transistors 25 and 26.

What is claimed is:

1. An integrated circuit comprising a plurality of voltage-current converters each having an input, and output and a bias-signal input for controlling the transconductance of said voltage-current converters by means of a bias signal on said bias-signal input, the transconductances of the voltage-current converters being in a substantially fixed ratio to each other, a bias-signal generator for applying bias signals which are in a substantially fixed ratio to each other to said bias-signal inputs, and a control network for controlling the bias-signal generator in such a way that the transconductances of the voltage-current converters are highly insensitive to process variations and variations in operating conditions, at least one of the voltage-current converters being included in the control network as a reference converter, characterized in that the control network comprises a first and a second current source, supplying currents ($I_1$ and $nI_1$ respectively) in a substantially fixed ratio to each other, an input, coupled to the input of the reference converter, for coupling to a reference resistor, which input is included in the output circuit of the first current source, and a comparing control amplifier, coupled between the output of the reference converter and a control input of the bias-signal generator for comparing the output current of the reference converter and the current from the second current source and controlling the bias-signal generator in such a way that a substantially fixed ratio is maintained between the output currents of the reference converter and the second current source.

2. An integrated circuit as claimed in claim 1, characterized in that the bias settings of the voltage-current converters are current controlled, that the control network comprises a current mirror having one input and a multiplicity of outputs, which outputs are coupled to the bias inputs of the voltage-current converters and whose input is included in the drain circuit of a transistor having gate electrode connected to the output of the reference converter, and that the first and the second current source comprised of a second current mirror circuit having an input to which a bias current is applied and a first output connected to the input of the reference converter and a second output connected to the output of the reference converter.

3. An integrated circuit as claimed in claim 1 wherein the comparing amplifier comprises a field effect transistor (FET) having a gate electrode coupled to the output of the reference converter, the bias signal generator comprising a first current mirror having an input coupled to the drain circuit of said FET and a plurality of outputs individually coupled to the bias signal inputs of the voltage-current converters, and wherein said first and second current sources comprise a second current mirror having an input coupled to a source of voltage and first and second outputs to the input and output, respectively, of the reference converter.

* * * * *

UNITED STATES PATENT AND TRADEMARK OFFICE
CERTIFICATE OF CORRECTION

PATENT NO. : 4,388,539
DATED : June 14, 1983
INVENTOR(S) : WOUTER M. BOEKE

It is certified that error appears in the above—identified patent and that said Letters Patent is hereby corrected as shown below:

In the Claims:

Claim 1, line 2, "and" should be --an--

Claim 1, line 18, after "source" delete ","

line 20, delete "," first and second occurrence line 23, after "amplifier" delete ","

Claim 2, line 10, "comprised" should be --comprise--, delete "of"

Claim 3, Col. 6, line 3, after "outputs" insert --coupled--

Signed and Sealed this

Thirteenth Day of September 1983

[SEAL]

Attest:

GERALD J. MOSSINGHOFF

Attesting Officer    Commissioner of Patents and Trademarks